United States Patent
Sunohara et al.

(10) Patent No.: US 7,217,888 B2
(45) Date of Patent: May 15, 2007

(54) ELECTRONIC PARTS PACKAGING STRUCTURE AND METHOD OF MANUFACTURING THE SAME

(75) Inventors: Masahiro Sunohara, Nagano (JP); Kei Murayama, Nagano (JP); Naohiro Mashino, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 277 days.

(21) Appl. No.: 10/717,591

(22) Filed: Nov. 21, 2003

(65) Prior Publication Data

US 2004/0113260 A1 Jun. 17, 2004

(30) Foreign Application Priority Data

Nov. 26, 2002 (JP) .............................. 2002-342024

(51) Int. Cl.
*H05K 1/16* (2006.01)
(52) U.S. Cl. ..................... 174/260; 174/261; 174/262
(58) Field of Classification Search ................. 174/260
See application file for complete search history.

(56) References Cited

U.S. PATENT DOCUMENTS

| 5,960,308 | A | * | 9/1999 | Akagawa et al. ........... 438/613 |
| 2001/0010627 | A1 | * | 8/2001 | Akagawa ..................... 361/761 |
| 2001/0011767 | A1 | * | 8/2001 | Osawa et al. ................ 257/691 |
| 2003/0218249 | A1 | * | 11/2003 | Ho et al. ..................... 257/737 |

* cited by examiner

*Primary Examiner*—Dean A. Reichard
*Assistant Examiner*—Yuriy Semenenko
(74) *Attorney, Agent, or Firm*—Armstrong, Kratz, Quintos, Hanson & Brooks, LLP.

(57) ABSTRACT

There is provided a electronic parts packaging structure that includes a mounted body on which an electronic parts is mounted, the electronic parts having a connection pad, which has an etching stopper film (a copper film, a gold film, a silver film, or a conductive past film) as an uppermost film, and mounted on the mounted body to direct the connection pad upward, an interlayer insulating film for covering the electronic parts, a via hole formed in the insulating film on the connection pad of the electronic parts, and a wiring pattern connected to the connection pad via the via hole.

6 Claims, 13 Drawing Sheets

ELECTRONIC PARTS PACKAGING STRUCTURE AND METHOD OF MANUFACTURING THE SAME

BACKGROUND OF THE INVENTION

1. Field of the Invention

The present invention relates to an electronic parts packaging structure and a method of manufacturing the same and, more particularly, an electronic parts packaging structure in which electronic parts are packaged on a wiring substrate in a state that such electronic parts are buried in an insulating film and a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

In reply to the request of further higher density, there is the semiconductor device in which the semiconductor chips are mounted on the wiring substrate in a state that they are buried in the insulating film. As an example, in Patent Application Publication (KOKAI) 2001-217337 (Patent Literature 1), the semiconductor device in which thinned semiconductor chips are face-up mounted on the wiring substrate in a state that such chips are buried in the insulating film and then electrode pads of the semiconductor chips are connected to external connection terminals provided on both surfaces of the wiring substrate via the via holes formed in the overlying insulating film, etc. is set forth.

Meanwhile, in order to manufacture the above semiconductor device, the via holes must be formed by etching the insulating film formed over the connection pads of the semiconductor chips by virtue of the laser, or the like. At this time, if the connection pads of the semiconductor chips are made of the aluminum (Al) film, such Al film has such a property that the Al film is etched easily by the laser. Thus, upon forming the holes in the insulating film by the laser, such a trouble is caused that the exposed Al film is etched by the laser and scattered around peripheries, and in turn a part of the connection pads disappears. For this reason, there is the problem that circuit elements formed under the connection pads and in neighboring underlying areas thereof are damaged by the laser.

In this case, in the above Patent Literature 1, no consideration is given to the above problem caused when the insulating film over the connection pads (Al film) of the semiconductor chips is etched by the laser.

SUMMARY OF THE INVENTION

It is an object of the present invention to provide an electronic parts packaging structure in which via holes can be formed on connection pads of the electronic parts to generate no trouble, in the electronic parts packaging structure in which the electronic parts are buried in an insulating film and are face up mounted on a wiring substrate, and a method of manufacturing the same.

The present invention is relevant to an electronic parts packaging structure which comprises a mounted body on which an electronic parts is mounted; the electronic parts having a connection pad, which is constructed by a laminated film to have an etching stopper film as an uppermost film, and mounted on the mounted body to direct the connection pad upward; an insulating film for covering the electronic parts; a via hole formed at least in a predetermined portion of the insulating film on the connection pad of the electronic parts; and a wiring pattern connected to the connection pad via the via hole.

In the electronic parts packaging structure of the present invention, the electronic parts is mounted on the mounted body to direct the connection pad upward (face up) in a state that this is buried in the insulating film. Then, the connection pad of the electronic parts is constructed by the laminated film having the etching stopper layer as the uppermost layer.

As one preferred embodiment of the connection pad, the connection pad is constructed by the laminated film selected from a group consisting of aluminum film/nickel film/copper film, aluminum film/nickel film/gold film, aluminum film/nickel film/copper film/gold film, aluminum film/nickel film/silver film, aluminum film/chromium film/copper film, aluminum film/conductive paste film, aluminum film/titanium film/conductive paste film, aluminum film/chromium film/conductive paste film, and aluminum film/titanium film/copper film, which are formed sequentially from a bottom respectively.

Also, via holes are formed in the insulating film on the connection pads of the electronic parts, and also the wiring patterns connected to the connection pads via the via holes are formed on the insulating film.

In the electronic parts packaging structure of the present invention, upon forming the via holes in the insulating film on the connection pads of the electronic parts by the laser, the uppermost film of the connection pad functions as the etching stopper layer in the laser process. This is because the copper film, the gold film, the silver film, the conductive paste film, or the like used as the etching stopper layer has a very small etching rate by the laser rather than the Al film as the normal material of the connection pad.

Therefore, unlike the case where the connection pad the uppermost layer of which is made of the Al film is employed, it is not possible that the connection pads under the via holes disappear or the circuit elements under the connection pads and in neighboring underlying areas thereof are damaged.

In this manner, the via holes formed in the insulating film on the connection pads of the electronic parts are formed easily by the ordinary laser process to generate no trouble. As a result, the electronic parts packaging structure in which the electronic parts are face up mounted on the mounted body in a situation that they are buried in the insulating film, and the connection pads of the electronic parts are connected to the wiring patterns via the via holes is easily manufactured not to bring about an increase in cost at a high yield.

DETAILED DESCRIPTION OF THE PREFERREDD EMBODIMENTS

Embodiments of the present invention will be explained with reference to the accompanying drawings hereinafter.

Figure 1A:
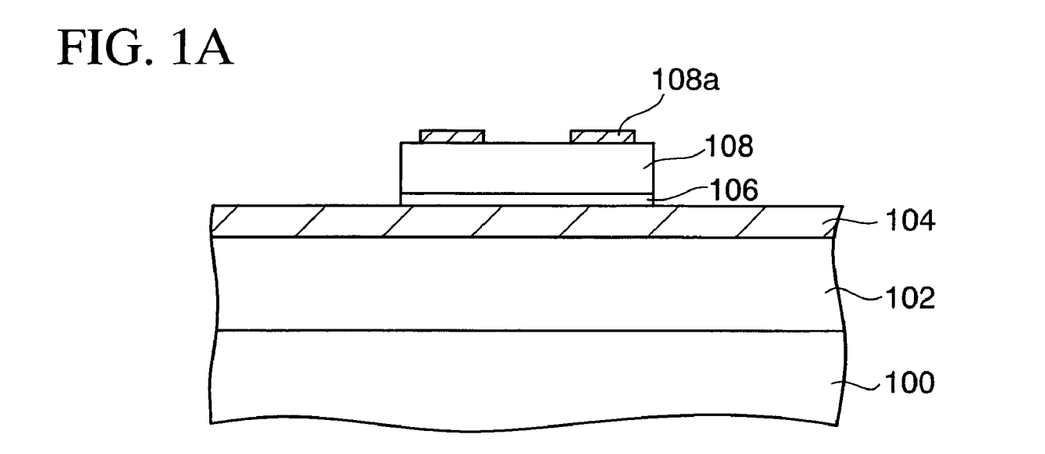
FIGS. 1A and 1B are sectional views showing drawbacks in manufacture of the semiconductor device in which the semiconductor chip is buried in the insulating film and packaged.
Figure 1B:
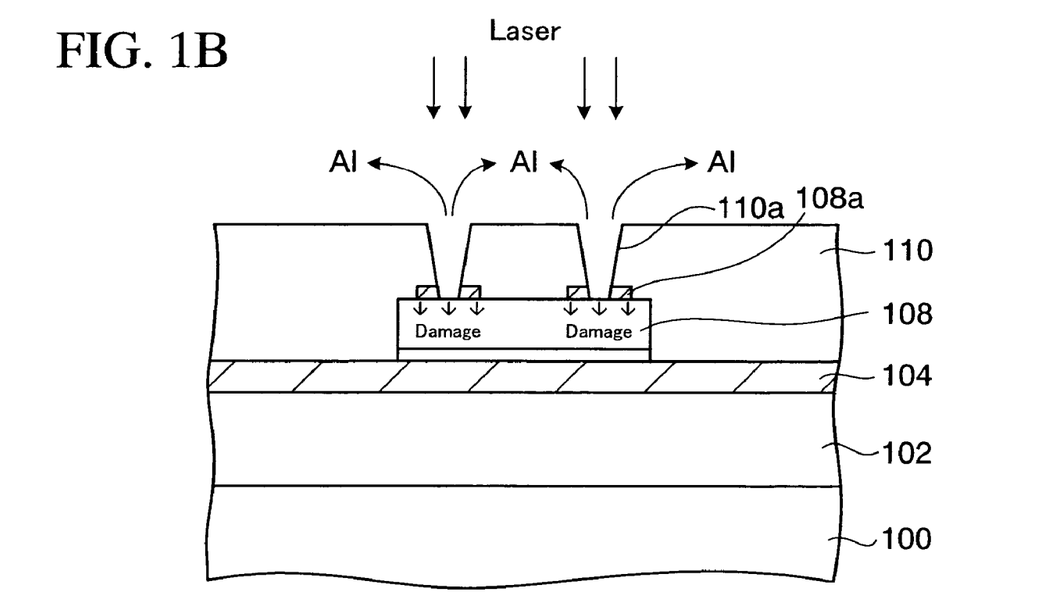

At first, drawbacks in manufacture of the semiconductor device in which the semiconductor chip is buried in the insulating film and packaged will be explained hereunder. FIGS. 1A and 1B are sectional views showing the drawbacks in manufacture of the semiconductor device in which the semiconductor chip is buried in the insulating film and packaged.

First, as shown in FIG. 1A, a first interlayer insulating film 102 is formed on a base substrate 100 having predetermined wiring patterns (not shown) thereon. Then, a Cu wiring 104 connected to wiring patterns on the base substrate 100 via via holes (not shown) formed in the first interlayer insulating film 102 is formed. A semiconductor chip 108 having Al pads 108a thereon is fixed onto the Cu wiring 104 via an adhesive layer 106 in a state that the connection terminals 108a are directed upward (in a face up fashion).

Then, as shown in FIG. 1B, a second interlayer insulating film 110 is formed on the semiconductor chip 108 and the Cu wiring 104. Then, predetermined portions of the second interlayer insulating film 110 on the Al pads 108a on the semiconductor chip 108 are etched by the laser to form via holes 110a.

At this time, the Al pads 108a on the semiconductor chip 108 have such a property that they are etched readily by the laser upon executing the over-etching after the etching of the second interlayer insulating film 110 is ended. Therefore, Al of the Al pads 108a are scattered around peripheries of the via holes 110a and in turn Al at bottom portions of the via holes 110a disappears in some case.

Further, because the Al pads 108a are broken by the laser, correspondingly circuit elements formed under the Al pads 108a and in neighboring underlying areas thereof are damaged. This causes reduction in chip yield of the semiconductor device.

Electronic parts packaging structures of embodiments of the present invention can overcome the above-mentioned problems.

(First Embodiment)

Figure 3:
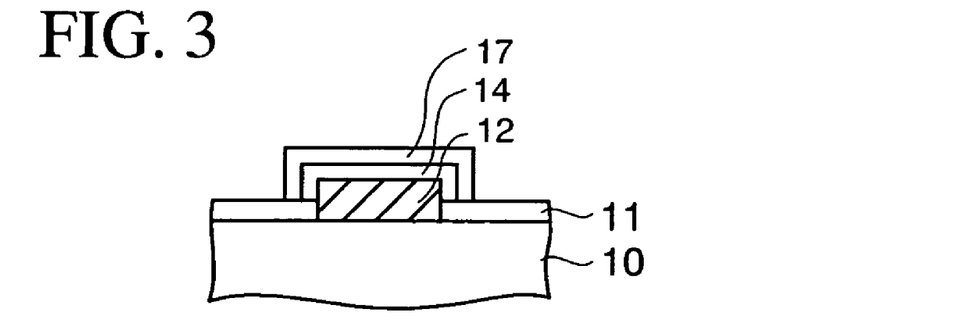
FIG. 3 is a partial sectional view showing a variation 1 of a connection pad according to the electronic parts packaging structure of the first embodiment of the present invention.
Figure 4:
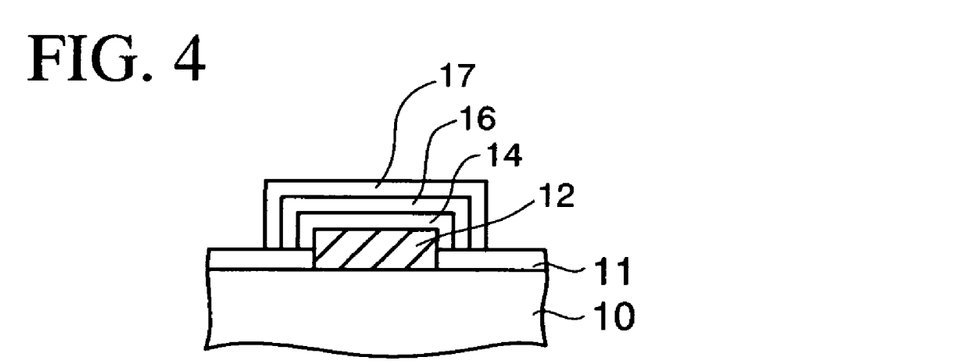
FIG. 4 is a partial sectional view showing a variation 2 of a connection pad according to the electronic parts packaging structure of the first embodiment of the present invention.
Figure 5:
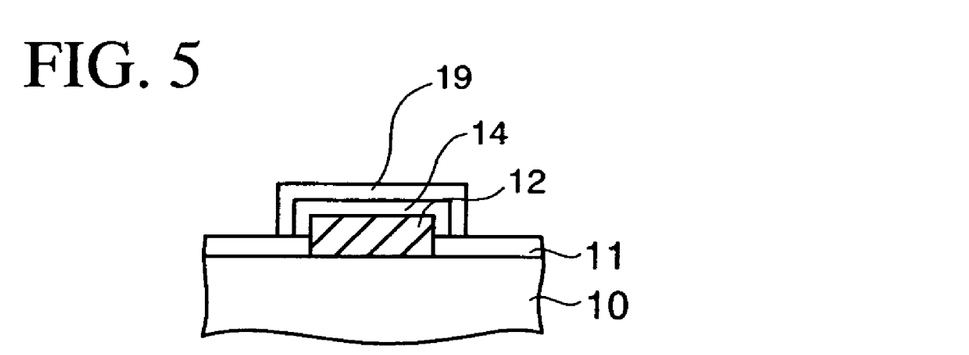
FIG. 5 is a partial sectional view showing a variation 3 of a connection pad according to the electronic parts packaging structure of the first embodiment of the present invention.

Next, a method of manufacturing an electronic parts packaging structure of a first embodiment of the present invention will be explained hereunder. FIGS. 2A to 2K are partial sectional views showing the method of manufacturing the electronic parts packaging structure of the first embodiment of the present invention. FIGS. 3 to 5 are partial sectional views showing variations of a connection pad according to the same electronic parts packaging structure.

Figure 2A:
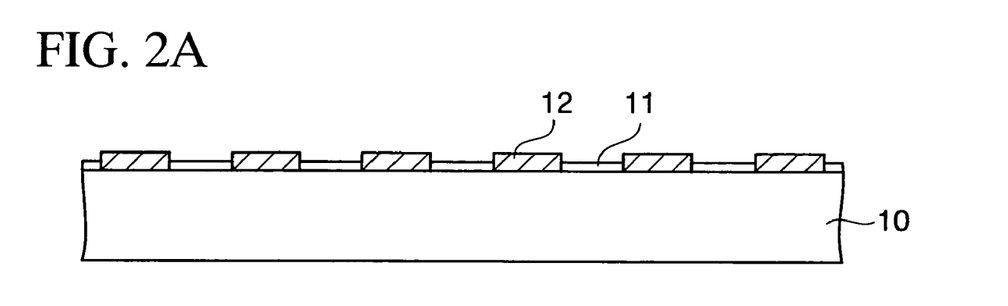
FIGS. 2A to 2K are partial sectional views showing a method of manufacturing an electronic parts packaging structure of a first embodiment of the present invention.

First, as shown in FIG. 2A, a silicon wafer (semiconductor wafer) 10 on which predetermined transistors, multilayered wirings (not shown), etc. are formed and which has a thickness of about 400 μm is prepared. Al pads 12 made of aluminum (Al) or Al alloy are exposed from an upper surface of the silicon wafer 10, and portions of the silicon wafer 10 except the Al pads 12 are covered with a passivation film 11 made of a silicon nitride film, polyimide resin, or the like.

Figure 2B:
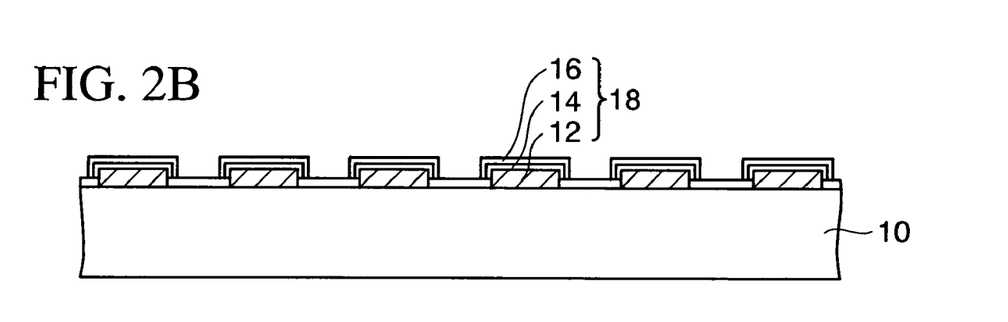

Then, as shown in FIG. 2B, a nickel (Ni) film 14 is formed on the Al pads 12 of the silicon wafer 10 by the electroless plating. An example of the forming method will be explained in detail. First, the degreasing is applied by processing the silicon wafer 10 with the pretreatment solution (1) containing an acidic dipping degreasing material. Then, the soft etching is applied by processing the silicon wafer 10 with the pretreatment solution (2) such as a mixed liquid of an ammonium peroxodisulfate solution or a hydrogen peroxide solution and sulfuric acid, or the like.

Then, the acid cleaning is applied by processing the silicon wafer 10 with the pretreatment solution (3) such as hydrochloric acid, dilute sulfuric acid, or the like. Then, the activator processing is applied by processing the silicon wafer 10 with the pretreatment solution (4) containing a catalyst applying material of palladium series.

In this manner, the pretreatment is applied to execute the nonelectrolytic plating of the Ni film 14 on the Al pads 12 of the silicon wafer 10. In this case, because the Al pads 12 have tolerance for the above pretreatment solutions (1) to (4), the trouble such that the Al pads 12 are etched by the pretreatment solution is never generated.

Then, the silicon wafer 10 is dipped in the plating liquid having the composition of nickel sulfamate (400 g/liter), nickel (100 g/liter), nickel boromide (15 g/liter), boric acid (40 g/liter), for example. Thus, the Ni film 14 of about 1 to 3 μm thickness is selectively formed on the Al pads 12 of the silicon wafer 10.

Then, as shown similarly in FIG. 2B, a copper (Cu) film 16 is formed on the Ni films 14 of the silicon wafer 10 by the electroless plating. An example of the forming method will be explained in detail. First, the conditioning process is applied by processing the silicon wafer 10 with the pretreatment solution (1) containing a surfactant. Then, the soft etching is applied by processing the silicon wafer 10 with the pretreatment solution (2) such as a mixed liquid of an ammonium peroxodisulfate or hydrogen peroxide solution and sulfuric acid, or the like.

Then, the acid cleaning is applied by processing the silicon wafer 10 with the pretreatment solution (3) such as hydrochloric acid, dilute sulfuric acid, or the like. Then, the activator processing is applied by processing the silicon wafer 10 with the pretreatment solution (4) containing the palladium colloidal solution. Then, the accelerator processing is applied by processing the silicon wafer 10 with the pretreatment solution (5) such as hydrochloric acid, dilute sulfuric acid, or the like.

In this way, the pretreatment is applied to execute the electroless plating of the Cu film on the Ni films 14 of the silicon wafer 10. In this case, because the Ni films 14 have tolerance for the above pretreatment solutions (1) to (5), the trouble such that the Ni films 14 are etched by the pretreatment solution is never generated.

Then, as shown similarly in FIG. 2B, the silicon wafer 10 is dipped in the plating liquid (temperature: almost 45° C.) containing copper sulfate, sodium hydrate, formaldehyde, Rochelle salt, and surfactant, for example. Thus, the Cu film 16 of about 1 to 5 μm thickness is selectively formed on the Ni films 14.

Accordingly, the Ni film 14 and the Cu film 16 are selectively formed on the Al pads 12 and thus connection pads 18 are obtained. The Cu film 16 as the uppermost layer of the connection pad 18 acts as the etching stopper layer when a via hole is formed in the interlayer insulating film, which is formed over the Al pad 12, by the laser. This is because the Cu film has the very low etching rate by the laser rather than the Al film.

In this case, a method of forming directly the Cu film 16 on the Al pad 12 without intervention of the Ni film 14 may be employed. But it is apprehended that corrosion of the Al pads 12 is caused if a series of pretreatments are applied in the electroless plating of the Cu films 16 in a situation that the Al pads 12 are exposed, and thus this method is not preferable.

In the above mode, the structure that the Cu films 16 having a small etching rate by the laser is formed as the uppermost layer is shown as the connection pads 18. As the metal having a small etching rate by the laser, there may be listed a gold (Au) film, a silver (Ag) film, or the like in addition to the Cu film.

Therefore, following structures may be employed as the structure of the connection pad 18. More particularly, as a variation 1 of the connection pad 18, as shown in FIG. 3, a connection pad may be formed sequentially of the Al pad 12, the Ni film 14 of about 1 to 3 μm thickness, and a gold (Au) film 17 of about 0.05 to 0.15 μm thickness from the bottom. In this case, the Au film 17 is selectively formed on the Ni films 14 by dipping the silicon wafer 10, on which the Ni films 14 are formed, in the plating liquid (temperature: almost 50° C.) containing gold (10 g/liter), organic acid such as citric acid, acetic acid, or the like (100 g/liter), hydroxide such as KOH, NaOH, or the like (50 g/liter), and cobalt or nickel (100 mg/liter), for example.

Also, as a variation 2 of the connection pad, as shown in FIG. 4, a connection pad that is formed sequentially of the Al pad 12, the Ni film 14 of about 1 to 3 μm thickness, the Cu film 16 of about 1 to 5 μm thickness, and the Au film 17 of about 0.05 μm thickness from the bottom may be employed.

In addition, as a variation 3 of the connection pad, as shown in FIG. 5, a connection pad that is formed sequentially of the Al pad 12, the Ni film 14 of about 1 to 3 μm thickness, and a silver (Ag) film 19 of about 1 to 5 μm thickness from the bottom may be employed. The Ag film 19 is formed selectively on the Ni films 14 by the ordinary electroless plating.

In this manner, the connection pad 18 according to the present embodiment is formed in a situation that the metal film (the Cu film 16, the Au film 17, the Ag film 19, or the like) whose etching rate by the laser is smaller than the Al film is coated as the uppermost layer. In addition, in the present embodiment, the metal film formed on the Al pad 12 is formed selectively not by using the masking step but by the electroless plating. In this case, it is of course that variations except the examples of the connection pad 18 having the above laminated structure may also be applied.

Figure 2C:
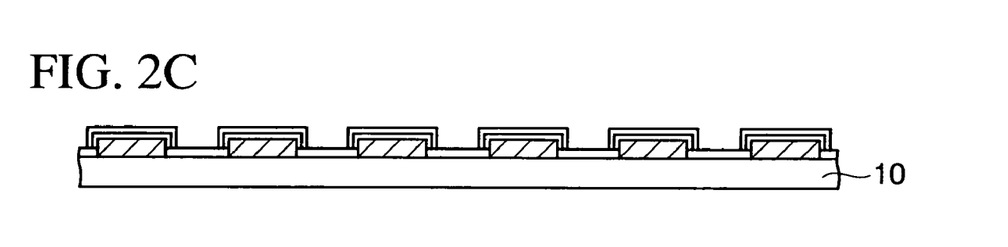

Then, as shown in FIG. 2C, the element non-formed surface (referred to as a "back surface" hereinafter) of the silicon wafer 10 is ground by the grinder. Thus, the silicon wafer 10 of about 400 μm thickness is reduced to a thickness of about 10 to 150 μm thickness.

Figure 2D:
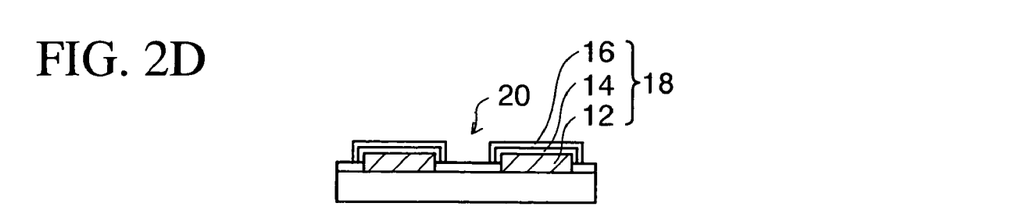

Then, as shown in FIG. 2D, a plurality of semiconductor chips 20 (electronic parts) that are divided into individual pieces are obtained by dicing the silicon wafer 10. In this case, the semiconductor chip 20 is exemplified as the electronic parts. But various electronic parts, e.g., the silicon chip on one surface of which capacitor elements, resistors are provided, etc. may be employed.

Next, an example of the wiring substrate on which the above semiconductor chip 20 is mounted will be explained hereunder.

Figure 2E:
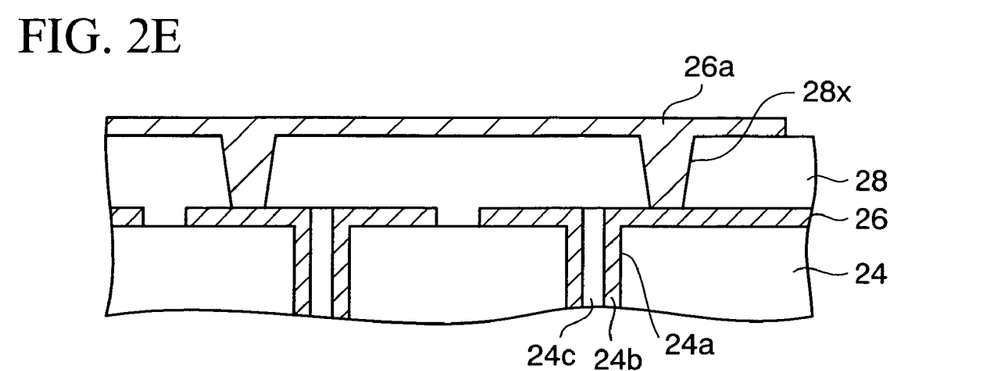

First, as shown in FIG. 2E, a base substrate 24 used to manufacture a built-up wiring substrate is prepared. This base substrate 24 is made of insulating material such as a resin, or the like. Also, through holes 24a are provided in the base substrate 24, a through-hole plating layer 24b connected to a first wiring pattern 26 formed on the base substrate 24 is formed on inner surfaces of the through holes 24a, and through holes are filled with a resin body 24c.

Then, a first interlayer insulating film 28 for covering the first wiring patterns 26 is formed. As the first interlayer insulating film 28, a resin film such as epoxy resin, polyimide resin, polyphenylene ether resin may be employed. For example, a resin layer of about 30 to 50 μm thickness is formed by laminating the resin film on the first wiring patterns 26 and then curing the film by the annealing at 80 to 100° C.

In this case, the resin layer as the first interlayer insulating film 28 may be formed by the spin coating method or the printing method, in addition to the above method of laminating the resin film. Also, the silicon oxide film formed by the CVD method, or the like may be employed in addition to the resin layer as the first interlayer insulating film 28.

Then, first via holes 28x are formed in predetermined portions of the first interlayer insulating film 28 on the first wiring patterns 26.

Then, second wiring patterns 26a are formed on the first interlayer insulating film 28 by the semi-additive method. Explanation will be given in more detail hereunder. A seed Cu layer (not shown) is formed on inner surfaces of the first via holes 28x and an upper surface of the first interlayer insulating film 28, and then a resist film (not shown) having opening portions in a predetermined pattern is formed. Then, a Cu film is formed on the opening portions of the resist film by the electro plating using the seed Cu film as the plating power-supply layer. Then, the resist film is removed, and then the seed Cu film is etched by using the Cu film as a mask. Thus, the second wiring patterns 26a connected to the first wiring patterns 26 via the first via holes 28x are formed.

Here, the second wiring patterns 26a may be formed by the subtractive method or the full additive method instead of the semi-additive method.

Figure 2F:
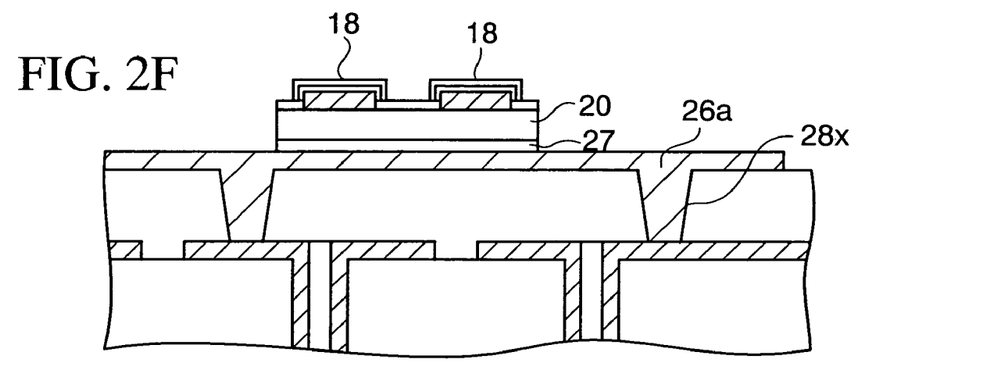

Then, as shown in FIG. 2F, the back surface of the above semiconductor chip 20 is adhered onto the second wiring pattern 26a via an adhesive layer 27. Thus, the semiconductor chip 20 is mounted in a state that the connection pads 18 are directed upward (face up mounting)

Figure 2G:
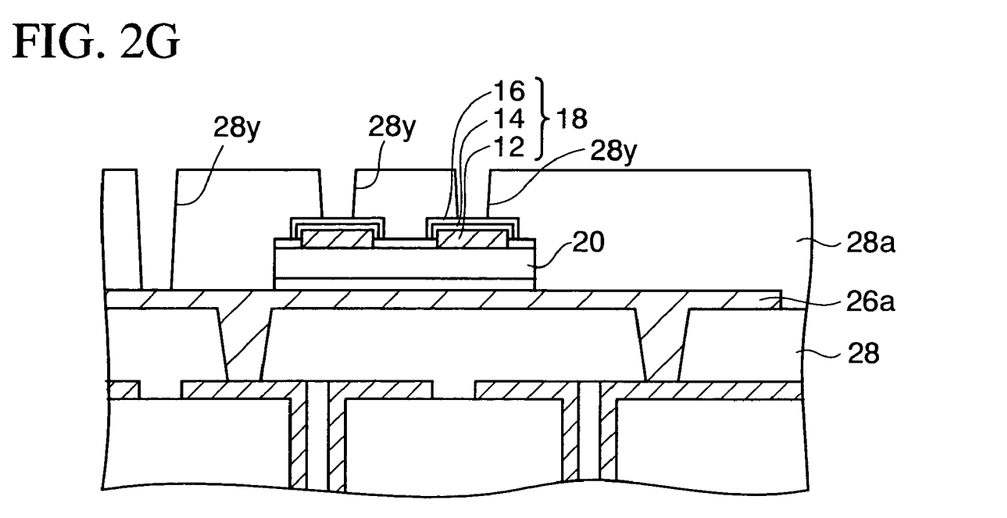

Then, as shown in FIG. 2G, a second interlayer insulating film 28a made of the same resin layer as the above first interlayer insulating film 28, or the like is formed on the semiconductor chip 20 and the second wiring patterns 26a. Then, second via holes 28y are formed by etching predetermined portions of the second interlayer insulating film 28a on the connection pads 18 of the semiconductor chip 20 by means of the laser. According to this step, the second via holes 28y are also formed by etching predetermined portions of the second interlayer insulating film 28a on the second wiring patterns 26a by means of the laser.

At this time, the uppermost layers of the connection pads 18 are exposed to the laser in the over-etching executed after the second interlayer insulating film 28a is etched by the laser. However, since the uppermost layers of the connection pads 18 are made of the Cu film 16 whose etching rate by the laser is small, the Cu film 16 functions as the etching stopper layer. Therefore, unlike the case that the connection pad is made of the Al film, it is possible to avoid the event that Al is scattered from the connection pads 18 to their peripheries or the circuit elements formed under the connection pads 18 and in neighboring underlying areas thereof are damaged. Now, the similar advantages can be achieved if the uppermost layers of the connection pads 18 are made of the Au film 17, the Ag film 19, or the like (FIGS. 3 to 5).

As the laser, a $CO_2$ laser (wavelength: 10.64 nm), a YAG laser (third harmonic (wavelength: 0.355 nm)), a KrF excimer laser (wavelength: 0.248 nm), or the like may be employed.

It is preferable that, if the uppermost layers of the connection pads 18 are made of the Cu film 16, the $CO_2$ laser having the smaller etching rate of the Cu film 16 than other lasers should be employed. Also, it is preferable that, if the uppermost layers of the connection pads 18 are made of the Ag film 19, the YAG laser having the smaller etching rate of the Ag film 19 than other lasers should be employed.

Also, it is preferable that, in order to enhance the thermal conductivity and suppress heat generation at the time of laser irradiation, the etching stopper layer (Cu film 16, etc.) should be set to have as thick a film thickness as possible and have as large a pad area as possible. As a preferred example based on such aspect, the film thickness of the Cu film 16 is set to about 3 μm or more, the pad area of the connection pad 18 is set to about 80 μm☐ to 100 μm☐, and a diameter of the second via holes 28y is set to about 50 to 60 μm.

Here, when the via holes are formed by using the RIE (Reactive Ion Etching) in place of the laser, the connection pads 18 having the above structure can suppress sputtering of the material of the connection pads 18 at the time of over-etching rather than the case that the Al pads are employed. Therefore, the connection pads 18 having such structure are convenient.

Figure 2H:
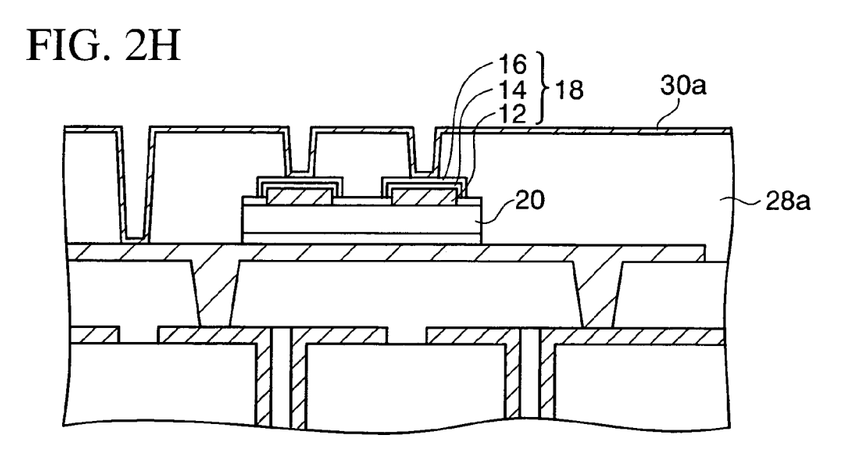

Then, as shown in FIG. 2H, a seed Cu film 30a is formed on the structural body (FIG. 2G), from which the connection pads 18 of the semiconductor chip 20 are exposed, by the electroless plating. At this time, if the connection pads 18 are made of the Al film only, it is possible that the trouble of the adhesiveness between the connection pads 18 and the seed Cu film 30a is caused. However, in the present embodiment, since the seed Cu film 30a is formed on the etching stopper layers (in the example in FIG. 2H, the Cu film 16) as the uppermost layers of the connection pads 18, the adhesiveness between the connection pads 18 and the seed Cu film 30a can be improved.

Figure 2I:
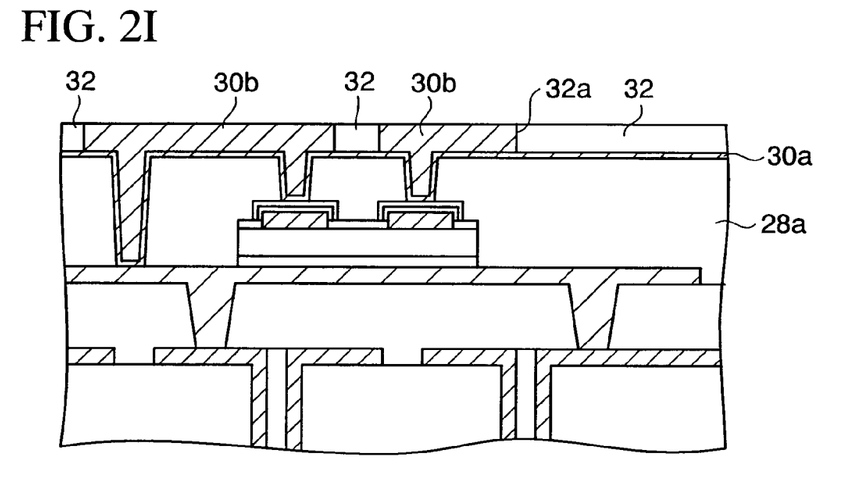

Then, as shown in FIG. 2I, a resist film 32 having opening portions 32a that correspond to third wiring patterns is formed on the seed Cu film 30a by the photolithography. Then, Cu film patterns 30b are formed in the opening portions 32a of the resist film 32 by the electro plating using the seed Cu film 30a as the plating power-supply layer.

Figure 2J:
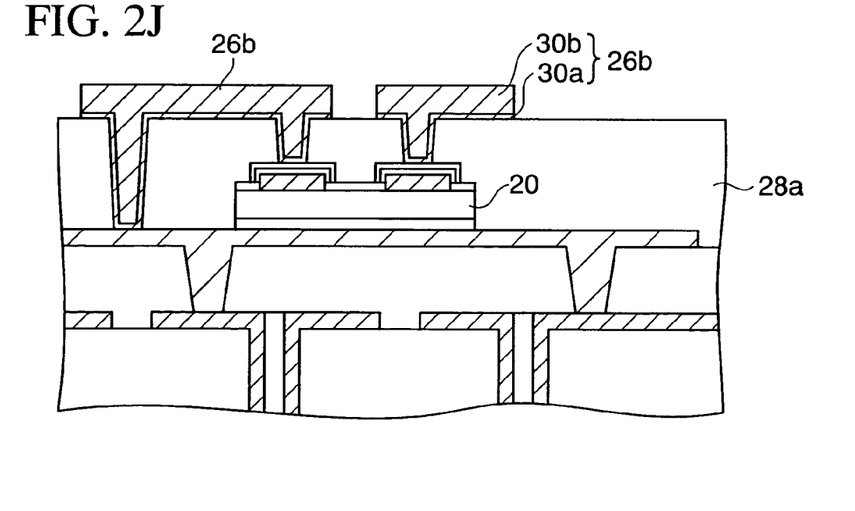

Then, as shown in FIG. 2J, the resist film 32 is removed. Then, third wiring patterns 26b are formed by applying the wet etching to the seed Cu film 30a while using the Cu film patterns 30b as a mask. Here, the interlayer insulating film, in which the semiconductor chips 20 are built, and the wiring patterns may be formed in a multi-layered fashion by repeating steps in FIG. 2F to FIG. 2J predetermined times after this step.

Figure 2K:
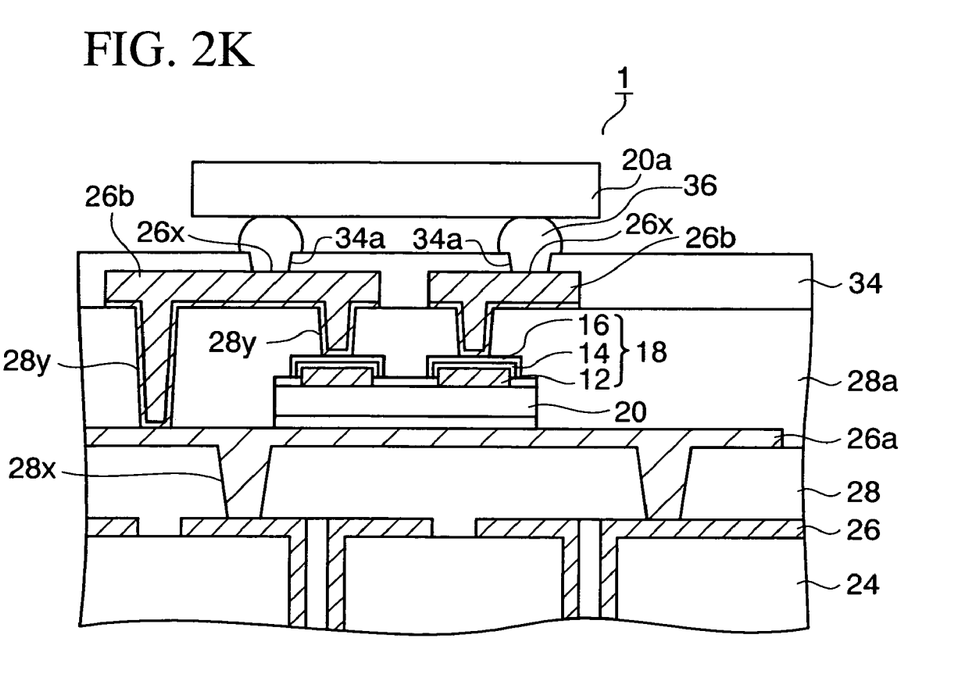

Then, as shown in FIG. 2K, a solder resist film 34 having opening portions 34a at their connection portions 26x is formed on the third wiring patterns 26b. Then, a semiconductor chip 20a having bumps 36 thereon is prepared. Then, the bumps 36 of the semiconductor chip 20a are bonded to the connection portions 26x of the third wiring patterns 26b by the flip-chip bonding. At this time, Ni/Au plating is applied to the connection portions 26x of the third wiring patterns 26b.

In this case, the bumps may be formed by mounting solder balls on the opening portions 34a in the solder resist film 34, or the like, and then the connection terminals of the semiconductor chip 20a may be bonded to the bumps. Also, if the structural body in FIG. 2K must be divided to include the semiconductor chips 20a by a predetermined number, the semiconductor chips 20a may be divided before or after the flip-chip mounting.

With the above, an electronic parts packaging structure 1 of the present embodiment is completed.

In the electronic parts packaging structure 1 of the first embodiment, the semiconductor chip 20 is face-up mounted on the second wiring patterns 26a over the base substrate 24 in a state that such semiconductor chip 20 is buried in the second interlayer insulating film 28a. The connection pads 18 of the semiconductor chip 20 have the etching stopper layer (the Cu film 16, or the like) made of the material, which is hard to be etched by the laser, as the uppermost layer. The second via holes 28y that are perforated by the laser are formed in the second interlayer insulating film 28a on the connection pads 18 of the semiconductor chip 20.

The third wiring patterns 26b connected to the connection pads 18 of the semiconductor chip 20 are connected electrically to the second wiring patterns 26a via the second via holes 28y. In addition, the solder resist film 34 having the opening portions 34a at the connection portions 26x of the third wiring patterns 26b is formed, and then the bumps 36 of the semiconductor chip 20a are mounted onto the connection portions 26x of the third wiring patterns 26b by the flip-chip mounting. In this manner, the connection pads 18 of the semiconductor chip 20 are connected to predetermined wiring patterns on the wiring substrate and also the semiconductor chip 20 is connected mutually to the semiconductor chip 20a arranged over this chip.

In this case, in the present embodiment, the mode that the semiconductor chip 20 is mounted on the second wiring pattern 26a on the wiring substrate in a state that such chip 20 is buried in the second interlayer insulating film 28a is exemplified. A mode that the semiconductor chip 20 is mounted on the first wiring pattern 26 or the third wiring pattern 26b in a state that similarly such chip 20 is buried in the interlayer insulating film may be employed. Otherwise, a mode that the semiconductor chip 20 is mounted on the base substrate 24, or the first or second interlayer insulating film 28, 28a may be employed. That is, as the mounted body on which the semiconductor chip 20 is mounted, there are the base substrate 24, the first to third wiring patterns 26 to 26b, the first or second interlayer insulating film 28, 28a, or the like.

In addition, there may be employed a mode that a plurality of semiconductor chips 20 are buried similarly in plural interlayer insulating films respectively and are stacked three-dimensionally in a multi-layered fashion to package and these semiconductor chips 20 are connected mutually via a plurality of via holes.

In the electronic parts packaging structure 1 of the present embodiment, as described above, the connection pads 18 of the semiconductor chip 20 have the etching stopper layer (the Cu film 16, the Au film 17, the Ag film 19, or the like) in the laser process as the uppermost layer. Therefore, the second via holes 28y are formed in the second interlayer insulating film 28a by the ordinary laser via forming method to generate no trouble. For this reason, in the laser via forming step, there can be eliminated a possibility such that the connection pads 18 of the semiconductor chip 20 disappear or the circuit elements under the connection pads 18 and in the neighborhood underlying areas are damaged.

According to the above, the electronic parts packaging structure 1 can be easily manufactured not to bring about an increase in cost at a high yield. In addition, even when the high-density electronic parts packaging structure is manufactured by forming the interlayer insulating film, in which the semiconductor chips 20 are built, and the wiring patterns in a multi-layered fashion, the high-performance packaging structure can be manufactured with high reliability.

(Second Embodiment)

FIGS. 6A to 6G are partial sectional views showing a method of manufacturing an electronic parts packaging structure according to a second embodiment of the present invention. FIGS. 7A to 7C are partial sectional views similarly showing a variation 1 of a connection pad forming method according to the electronic parts packaging structure. FIGS. 8A to 8D are partial sectional views similarly showing a variation 2 of a connection pad forming method according to the electronic parts packaging structure.

A different point of the second embodiment from the first embodiment resides in that not the electroless plating but the photolithography is employed as the method of forming selectively the etching stopper layer on the Al pad 12. In FIGS. 6A to 6G, FIGS. 7A to 7C, and FIGS. 8A to 8D, detailed explanation of the same elements and the same steps as those in FIGS. 2A to 2K will be omitted herein.

Figure 6A:
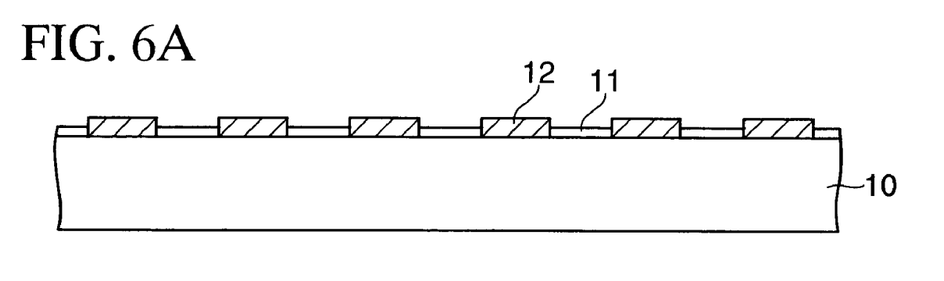
FIGS. 6A to 6G are partial sectional views showing a method of manufacturing an electronic parts packaging structure of a second embodiment of the present invention.
Figure 7A:
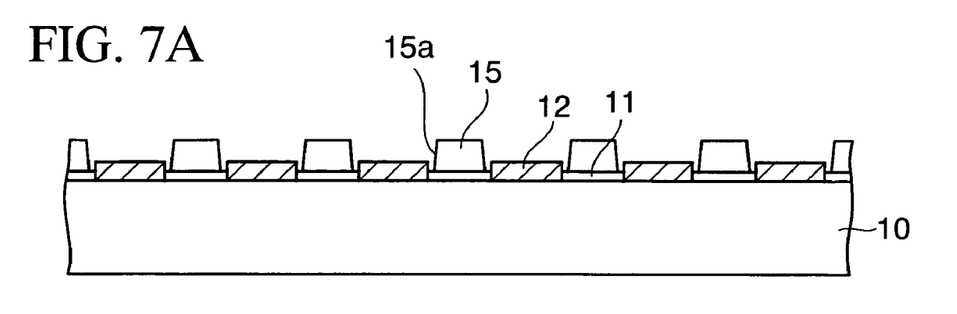
FIGS. 7A to 7C are partial sectional views showing a variation 1 of a connection pad forming method according to the electronic parts packaging structure of the second embodiment of the present invention.
Figure 7B:
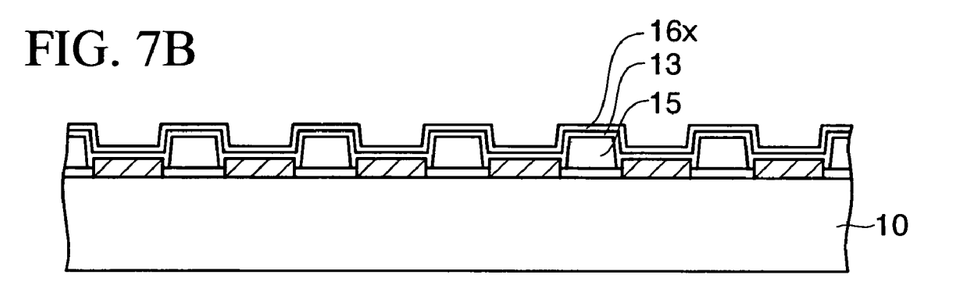
Figure 7C:
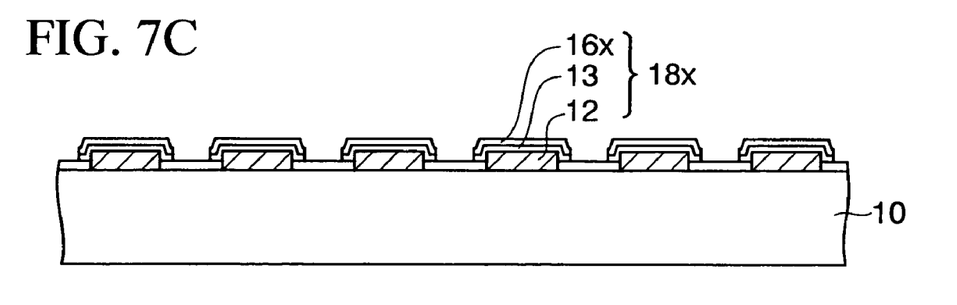

In the method of manufacturing the electronic parts packaging structure according to the second embodiment of the present invention, first, as shown in FIG. 6A, the silicon wafer 10 (semiconductor wafer) having the structure in which the Al pads 12 are exposed and other portions are covered with the passivation film 11, like FIG. 2A, is prepared by the same method as the first embodiment.

Figure 6B:
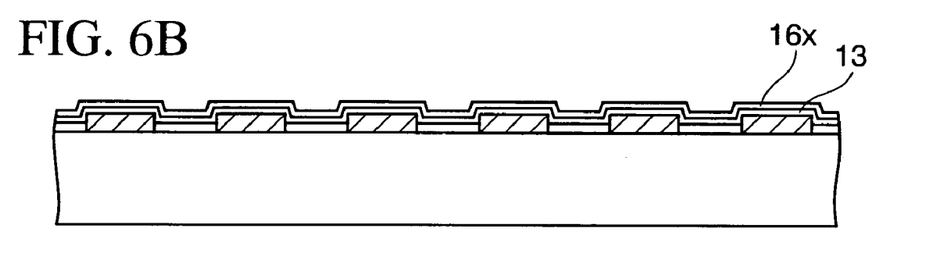

Then, as shown in FIG. 6B, a chromium (Cr) film 13 of about 0.05 μm thickness is formed on the Al pads 12 and the passivation film 11 by the sputter method, or the like. Here, a titanium (Ti) film may be employed instead of the chromium (Cr) film 13. Then, a Cu film 16x of about 0.05 to 2 μm thickness is formed on the Cr film 13 by the sputter method, or the like.

Figure 6C:
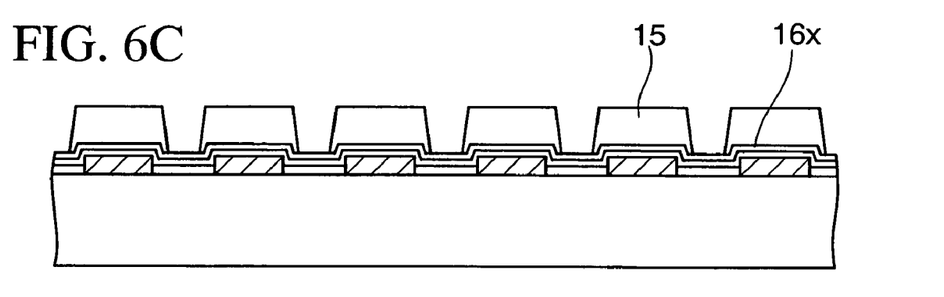

Then, as shown in FIG. 6C, resist film 15 that is patterned to cover the portions corresponding to the Al pads 12 is formed on the Cu film 16x by the photolithography. Then, the Cu film 16x is etched by the wet etching using a solution (ordinary temperature) containing hydrogen boromide (HBr) and ammonium peroxodisulfate while using the resist film 15 as a mask. Then, the Cr film 13 is etched by the wet etching using a solution (40° C.) containing iron trichloride ($FeCl_3$) and hydrochloric acid (HCl) while similarly using the resist film 15 as a mask. Then, the resist film 15 is removed.

Figure 6D:
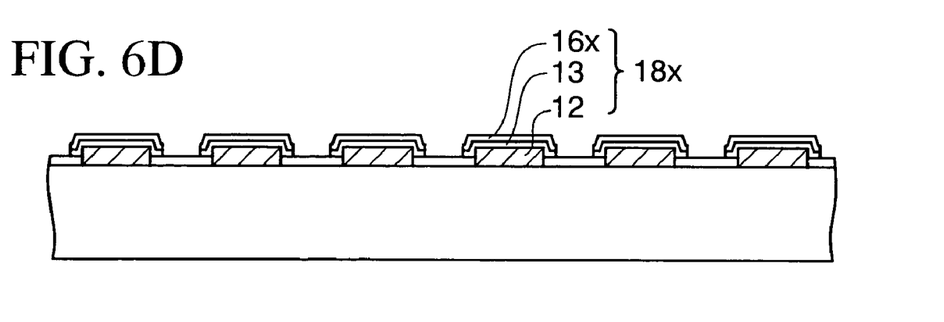

Thus, as shown in FIG. 6D, the Cr film 13 and the Cu film 16x are formed selectively on the Al pads 12, whereby connection pads 18x according to the second embodiment are obtained.

Next, variations of the method of forming the connection pads 18x according to the second embodiment will be explained hereunder. As the variation 1, first, as shown in FIG. 7A, the resist film 15 having opening portions 15a at the portions that correspond to the Al pads 12 is formed by the photolithography.

Then, as shown in FIG. 7B, the Cr film 13 and the Cu film 16x are formed sequentially on the Al pads 12 and the resist film 15 by the same method as above such as the sputter method, or the like.

Then, the resist film 15 is removed by the resist removing liquid. Thus, as shown in FIG. 7C, the Cr film 13 and the Cu film 16x formed on the resist film 15 are removed simultaneously with the resist film 15 by the so-called lift-off method and also the Cr film 13 (or the Ti film) and the Cu film 16x formed on the Al pads 12 are still left, whereby the connection pads 18x having the same structure as above are obtained. In this variation 1, the Ti film may be employed in place of the Cr film 13.

Figure 8A:
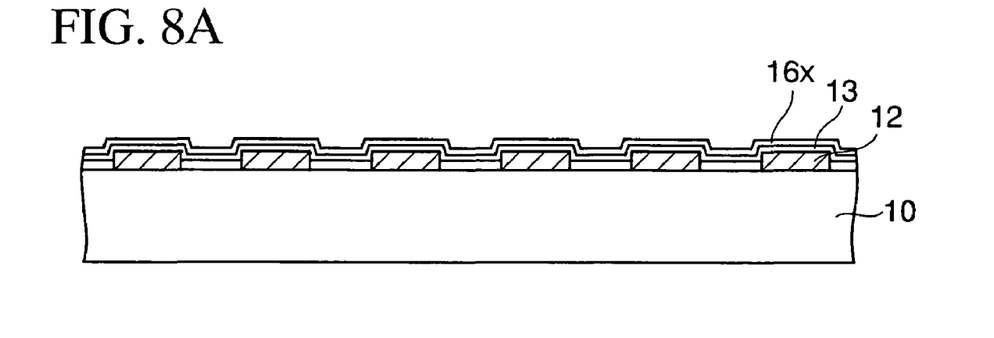
FIGS. 8A to 8D are partial sectional views showing a variation 2 of a connection pad forming method according to the electronic parts packaging structure of the second embodiment of the present invention.

Also, as the variation 2, first, as shown in FIG. 8A, the Cr film 13 of about 0.05 μm thickness and the first Cu film 16x of about 0.05 μm thickness are formed sequentially on the Al pads 12 and the passivation film 11 on the silicon wafer 10 having the same structure as FIG. 6A by the sputter method, or the like.

Figure 8B:
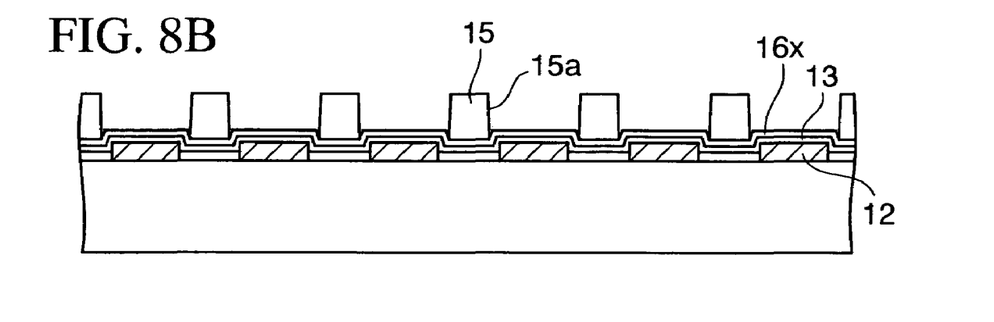
Figure 8C:
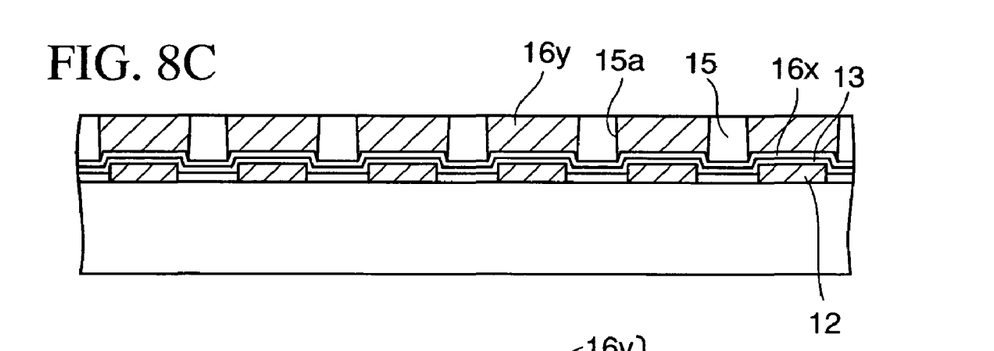

Then, as shown in FIG. 8B, the resist film 15 having the opening portions 15a at the portions of the first Cu film 16x, which correspond to the Al pads 12, is formed by the photolithography. Then, as shown in FIG. 8C, second Cu films 16y each having a thickness of about 5 to 10 μm are formed in the opening portions 15a of the resist film 15 by the electroplating utilizing the first Cu film 16x as the plating power-supply layer while using the resist film 15 as a mask.

Then, the resist film 15 is removed. Then, the first Cu film 16x and the Cr film 13 are etched sequentially by the wet etching using the same etchant as the above-mentioned method while using the second Cu films 16y as a mask.

Figure 8D:
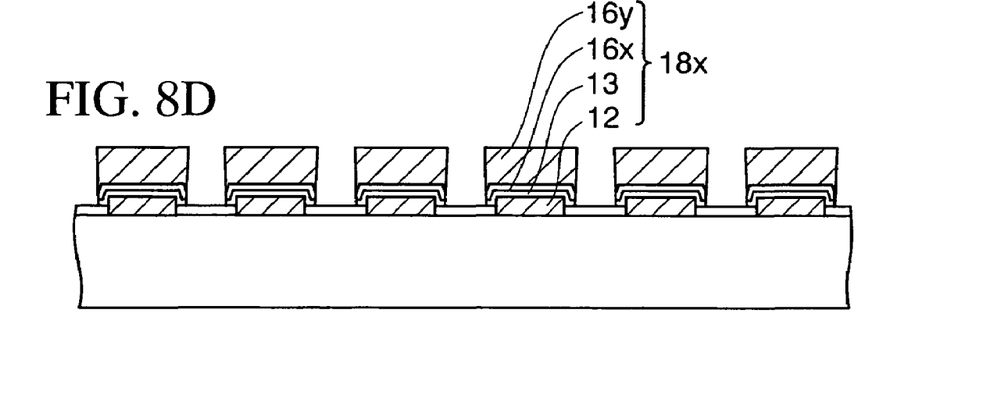

Thus, as shown in FIG. 8D, the Cr film 13, the first Cu film 16x, and the second Cu film 16y are formed selectively on the Al pads 12, so that the connection pads 18x are obtained. In the variation 2, the Ti film may be employed instead of the Cr film 13.

As explained in the first embodiment, if the Cu film having a large thickness (in excess of about 3 μm) is formed for the purpose of improving the thermal conductivity of the connection pads 18x, or the like, such a situation is supposed that a throughput or the like in the film formation or the wet etching offers a problem in the forming method by using the above sputter method and the photolithography. Therefore, in the variation 2, first the thin Cr film 13 and the thin first Cu film 16x are formed by the sputter method, and then the thick second Cu film 16y is formed selectively over the Al pads 12 by the electroplating. Then, the connection pads 18x are formed by etching the first Cu film 16x and the Cr film 13 while using the thick second Cu films 16y as a mask.

By doing this, in the second embodiment using the sputter method and the photolithography, the connection pads 18x having the thick etching stopper layer can be formed easily.

As described above, the connection pads 18x may be formed by using the forming method in the variation 1 or the variation 2.

Figure 6E:
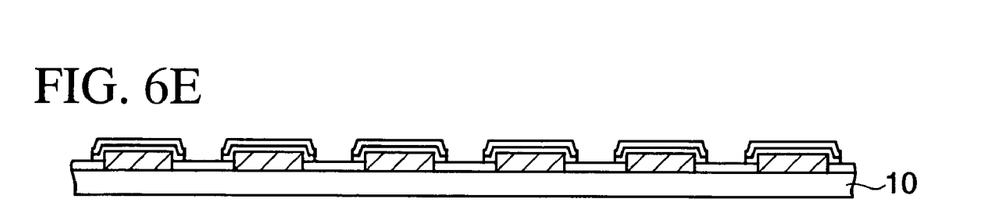

Then, as shown in FIG. 6E, like the first embodiment, the back surface of the silicon wafer 10 on which the connection pads 18x may be formed is ground by the grinder. Thus, a thickness of the silicon wafer 10 is thinned to 10 to 150 μm.

Figure 6F:
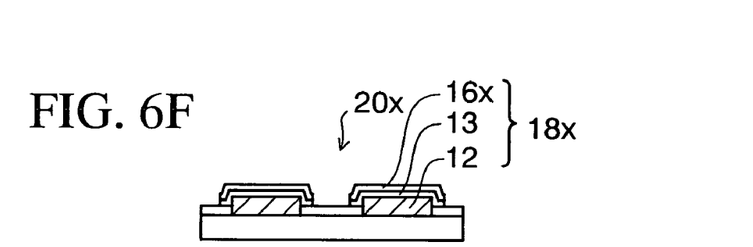

Then, as shown in FIG. 6F, like the first embodiment, the silicon wafer 10 on which the connection pads 18x are formed is diced. Thus, a plurality of semiconductor chips 20x that are divided into individual pieces are obtained.

Figure 6G:
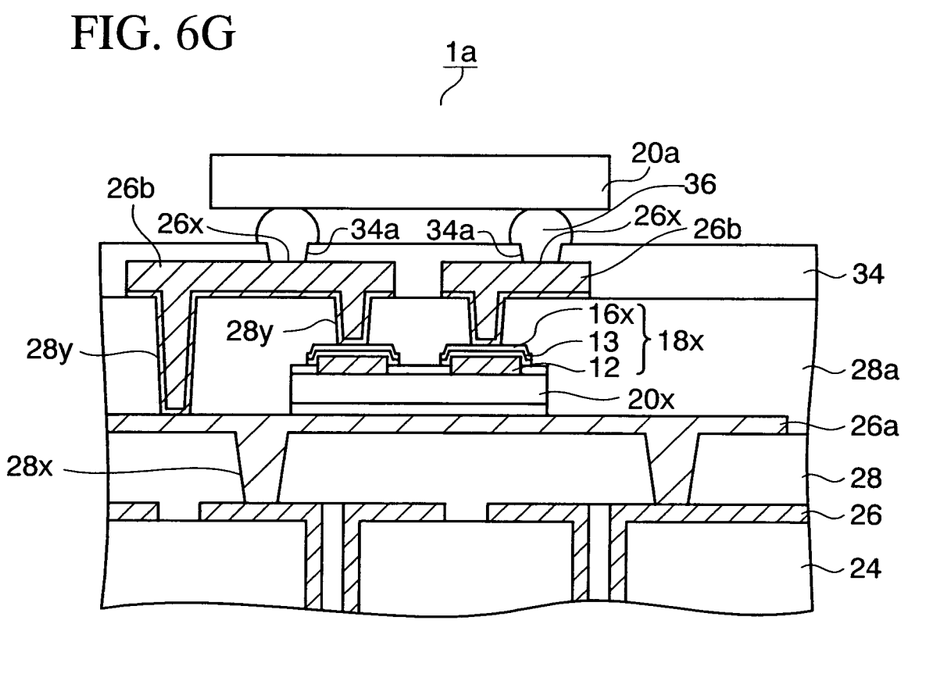

Then, as shown in FIG. 6G, the same steps as those in FIG. 2E to FIG. 2K in the first embodiment are carried out by using the semiconductor chip 20x. Thus, an electronic parts packaging structure 1a of the second embodiment can be obtained.

The electronic parts packaging structure 1a of the second embodiment can achieve the same advantages as the first embodiment.

In this case, various modifications and variations explained in the first embodiment may also be applied to the second embodiment.

(Third Embodiment)

FIGS. 9A to 9E are partial sectional views showing a method of manufacturing an electronic parts packaging structure of a third embodiment of the present invention. A different point of the third embodiment from the first embodiment is that the etching stopper layer in the laser process is formed by forming the conductive paste on the Al pads 12. In the third embodiment, detailed explanation of the same steps as those in the first embodiment will be omitted herein.

Figure 9A:
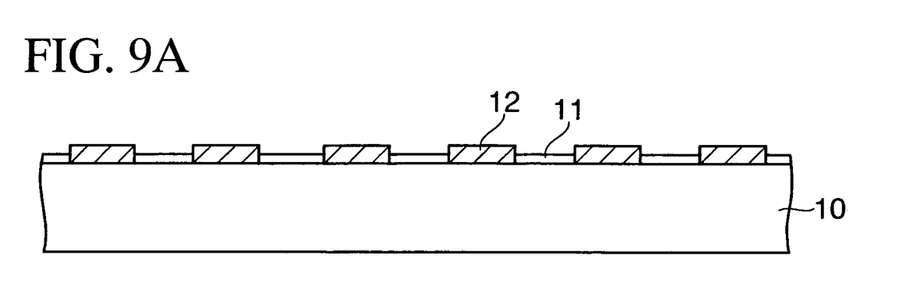
FIGS. 9A to 9E are partial sectional views showing a method of manufacturing an electronic parts packaging structure of a third embodiment of the present invention.
Figure 9B:
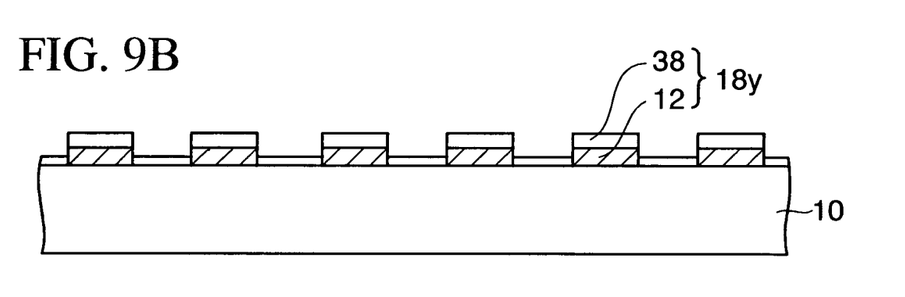

In the method of manufacturing the electronic parts packaging structure of the third embodiment of the present invention, first, as shown in FIG. 9A, the silicon wafer 10 (semiconductor wafer) having the same Al pads 12 as the first embodiment thereon is prepared. Then, as shown in FIG. 9B, a conductive paste film 38 is formed selectively on the Al pads 12. For example, the conductive paste film 38 is formed by coating the conductive paste material on the Al pads 12 by virtue of the screen printing, or the like and then curing the material. Accordingly, connection pads 18y each consisting of the Al pad 12 and the conductive paste film 38 are obtained.

As the conductive paste 38, for example, the paste formed by dispersing conductive particles such as copper (Cu), silver (Ag), gold (Au), nickel (Ni), or the like into an epoxy resin or a polyimide resin is employed. In the third embodiment, like the Cu film 16, or the like explained in the first embodiment, the conductive paste film 38 functions as the etching stopper layer in the laser process.

The etching stopper layer of about 10 μm thickness can be formed simply in a short time by utilizing the conductive paste film 38 without complicated steps.

In this case, a mode that the Cr film or the Ti film is formed between the Al pad 12 and the conductive paste film 38 may be employed. The Cr film or the Ti film may be formed selectively on the Al pads 12 by the sputter, the photolithography, or the electroplating.

Figure 9C:
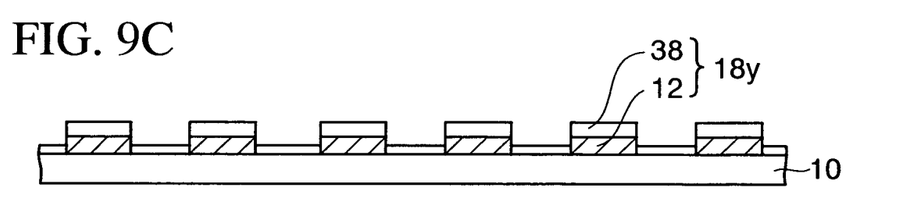

Then, as shown in FIG. 9C, like the first embodiment, the back surface of the silicon wafer 10 on which the connection pads 18y are formed is ground by the grinder. Thus, a thickness of the silicon wafer 10 is reduced to 10 to 150 μm.

Figure 9D:
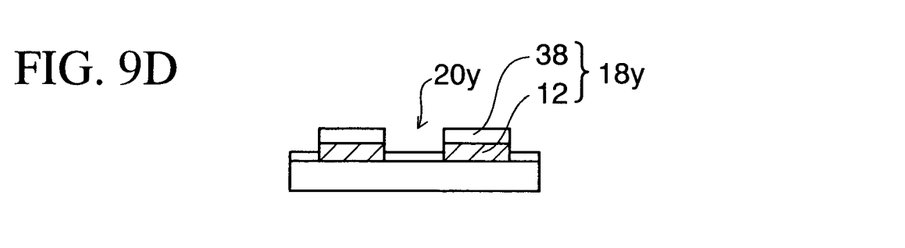

Then, as shown in FIG. 9D, like the first embodiment, the silicon wafer 10 on which the connection pads 18y are formed is diced. Thus, a plurality of semiconductor chips 20y that are divided into individual pieces are obtained.

Figure 9E:
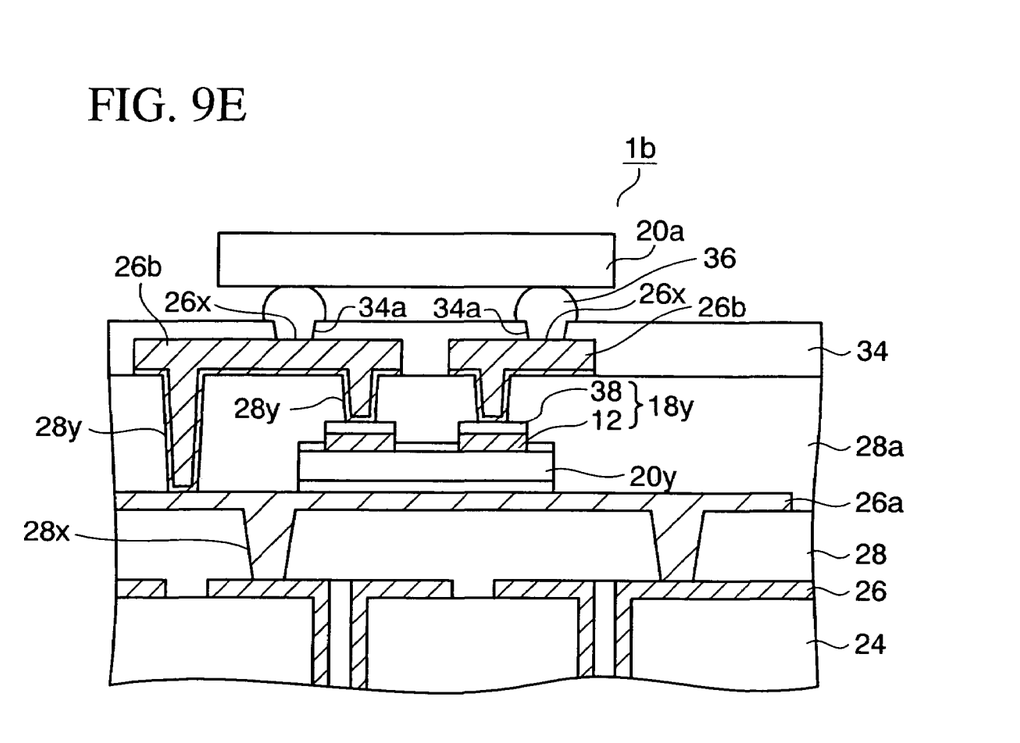

Then, as shown in FIG. 9E, the same steps as those in FIG. 2E to FIG. 2K in the first embodiment are carried out by using the semiconductor chip 20y. Thus, an electronic parts packaging structure 1b of the third embodiment can be obtained.

The electronic parts packaging structure 1b of the third embodiment can achieve the same advantages as the first embodiment.

In this case, various modifications and variations explained in the first embodiment may also be applied to the third embodiment.

With the above, details of the present invention are explained with reference to the first to third embodiments. The scope of the present invention is not limited to examples shown concretely in the above embodiments. It should be interpreted that variations of above embodiments within a range of the gist without departing from the present invention are contained in the scope of the present invention.

One of features of the present invention is that the etching stopper layer whose etching rate by the laser is lower than the metal pads is provided on the essential metal pads (e.g., Al pads) of the semiconductor chip.

In the embodiments, the mode that the metal film or the conductive paste film, whose etching rate by the laser is low, is provided on the Al pads is exemplified. But the mode that the metal film or the conductive paste film, whose etching rate by the laser is lower than the metal pads, is formed on the metal pads except Al may be employed. That is, the present invention can be applied to the electronic parts having desired various metal pads except the Al pads.

What is claimed is:

1. An electronic parts packaging structure comprising:
    a mounted body on which electronic parts are mounted;
        the electronic parts having a connection pad formed on a surface side of the electronic parts;
    the electronic parts being mounted on the mounted body to direct the connection pad upward,
        the connection pad being constructed of an aluminum pad and an etching stopper film covering the aluminum pad;
        the aluminum pad consisting of aluminum or an aluminum alloy;
    the etching stopper film bing constructed of a laminated film having layers of film; the uppermost film of the etching stopper film being selected from a member selected from a group consisting of a copper film, a gold film, a silver film, and a conductive paste film;
    an insulating film for covering the electronic parts;
    a via hole located at least in a predetermined portion of the insulating film on the connection pad of the electronic parts; and
    a wiring pattern connected to the connection pad via the via hole,
    wherein the via hole is connected to the aluminum pad via the etching stopper film.

2. The electronic parts packaging structure according to claim 1, wherein the mounted body is a base substrate having a wiring pattern thereon or a structural body in which an insulating film and a wiring pattern are laminated by a predetermined number on the base substrate, and the wiring pattern connected to the connection pad is connected electrically to the wiring patterns under the electronic parts via via holes formed in the insulating films.

3. The electronic parts packaging structure according to claim 2, wherein a plurality of electronic parts are packaged three-dimensionally in a state that the electronic parts are buried in a plurality of insulating films, and the plurality of electronic parts are connected mutually via the via holes formed in the insulating films and the wiring pattern.

4. The electronic parts packaging structure according to claim 1, wherein a bump of overlying electronic parts is mounted on the wiring pattern which is connected to the connection pad of the electronic parts by a flip-chip mounting.

5. The electronic parts packaging structure according to claim 1, wherein a thickness of the electronic parts is set to about 150 μm or less.

6. An electronic parts packaging structure according to claim 1, wherein the etching stopper film is constructed by the laminated film selected from a group consisting of nickel film/copper film, nickel film/gold film, nickel film/copper film/gold film, nickel film/silver film, chromium film/copper film, conductive paste film, titanium film/conductive paste film, chromium film/conductive paste film, and titanium film/copper film, which are formed sequentially from a bottom respectively.

* * * * *